PLASTIC ENCAPSULATED SEMICONDUCTOR DEVICES

Filed Aug. 15, 1968 3 Sheets-Sheet 1

INVENTOR
JAMES H. OVERMAN
Harold C. Meier
ATTORNEY

Sept. 21, 1971 J. H. OVERMAN 3,606,673

PLASTIC ENCAPSULATED SEMICONDUCTOR DEVICES

Filed Aug. 15, 1968 3 Sheets-Sheet 2

INVENTOR:

JAMES H. OVERMAN

Harold C. Meier

ATTORNEY

PLASTIC ENCAPSULATED SEMICONDUCTOR DEVICES

Filed Aug. 15, 1968

INVENTOR:
JAMES H. OVERMAN

Harold C. Meier

ATTORNEY

United States Patent Office 3,606,673
Patented Sept. 21, 1971

3,606,673

PLASTIC ENCAPSULATED SEMICONDUCTOR DEVICES

James H. Overman, Richardson, Tex., assignor to Texas Instruments Incorporated, Dallas, Tex.

Filed Aug. 15, 1968, Ser. No. 752,822
Int. Cl. B01j *17/00;* H01l *1/10*
U.S. Cl. 29—588 8 Claims

ABSTRACT OF THE DISCLOSURE

A plurality of semiconductor devices are encapsulated simultaneously in a thermosetting plastic by a process that includes the use of transfer molding techniques. Discrete semiconductor devices, such as transistors, are strip molded as a unit and separated after the thermosetting plastic has cured. Prior to the molding process, an array of lead wires interconnected by partially sheared tie-bars are staked to individual heat sinks also formed in a strip. A semiconductor device is mounted to each of the individual heat sinks and whisker lead wires are bonded to the active regions of the device and the lead wires. To prevent contamination of the semiconductor junctions with atmospheric impurities, the wafers are coated with a protective material. Grooves are coined into the heat sink to limit the wafer coating material to a restricted area. After the strip molding step has been completed, the individual semiconductor devices are separated by cutting the tie-bars and sawing the individual heat sinks.

This invention relates to encapsulated semiconductor devices, and more particularly to an improved process for encapsulating simultaneously a plurality of semiconductor devices by strip molding, and to components for fabricating semiconductor devices by transfer molding techniques.

Early semiconductor devices, such as transistors capable of handling relatively large power levels, were fabricated on solid metal headers, such as copper or steel, and enclosed in a metal can. When used at or below rated levels, these can packaged devices performed according to published specifications. However, the can enclosed semiconductor device, in addition to being costly to fabricate, was characterized by an inherent lack of flexibility and inefficient use of available space.

Recently, much effort has been expended to replace the can package for semiconductor devices with a plastic encapsulation. One of the main advantages of plastic encapsulation is that many of the fabrication steps are easily automated. Since semiconductor devices are small and delicate, any process which reduces handling and hand operations on the delicate semiconductor wafer not only provides a higher yield of acceptable devices, but also reduces the cost per unit.

Heretofore, plastic transfer molding of semiconductor device packages was carried out on a unit basis. Although a number of units were molded simultaneously, individual cavities were provided for each device. The individual cavities were connected to runner channels through gates. Because the finished package is relatively small, these connecting gates were somewhat narrow and they often became obstructed thereby hindering the flow of the plastic encapsulating material. Obviously, this reduced the yield and increased the unit cost. In addition to this shortcoming, fabricating semiconductor devices on an individual basis requires excessive handling of the very small and delicate semiconductor wafers. Even though the individual units were encapsulated simultaneously with others, a considerable amount of individual unit fabrication and handling was required.

An object of the present invention is to provide a process for strip mold encapsulation of semiconductor devices. Another object of this invention is to provide a process for fabricating semiconductor devices with a minimum of "flashing" or seepage from the mold cavity. Still another object of this invention is to provide a heat sink for controlling the flow of wafer coating material. A further object of this invention is to provide partially sheared interconnected leads for strip molding of semiconductor devices.

In accordance with the present invention, there is provided a process for fabricating a plurality of semiconductor devices in a single cavity mold as a unit. By fabricating a number of individual devices as a unit, the small delicate parts may be interconnected to form larger, more rugged parts. These larger parts are more easily handled by automatic machinery, thus enabling the elimination of hand operations. In addition, when hand operations are required, the larger parts reduce the risk of damaging the delicate semiconductor wafer. The strip molding concept of a large number of individual devices as a unit gives superior molding (fewer entrapments), and cuts cost by yielding more units per lineal foot of metal. Instead of an array of small cavities individually connected to runner channels, strip molding requires only a few cavities which may be individually connected to a runner channel. This enables the use of larger gates between the cavity and runner, thus insuring a better and more uniform encapsulation. The process is useful in encapsulating substantially any semiconductor device, including discrete components and integrated circuits.

Another important advantage of strip molding a large number of individual devices as a unit is that it enables the use of dies which substantially eliminate "flashing," that is, the seepage of hot plastic from the mold cavity.

In accordance with a specific embodiment of this invention, discrete component power transistors are fabricated as a unit. A frame consisting of interconnected heat sinks is staked to a frame of lead wires also formed as a unit by tie-bars interconnecting the various leads. The tie-bars have been partially sheared to facilitate separation after the molding process. These partially sheared tie-bars are designed to eliminate seepage of the hot plastic material from the mold. After the heat sink frame and the lead frame are staked together, individual transistor wafers are attached to the heat sinks and electrical continuity established to the lead wires. To prevent contamination of the semiconductor junctions, the wafers are coated with a sealing material, for example, a silicone rubber. The assembly is then placed in a mold and hot thermosetting plastic injected into the mold cavity. The mold contains hold-down pins which project through the lead frame to clamp the heat sink firmly against one mold surface, thus assuring that the heat sink surface of the finished package is flash-free. After the molding process has been completed, a series of ejector pins forces the complete unit from the mold. The tie-bars are now cut to separate the leads, and the heat sink is sawed to separate the individual devices.

A more complete understanding of the invention and its advantages will be apparent from the specification and claims and from the accompanying drawings illustrative of the invention.

Referring to the drawings.

Referring initially to FIGS. 1–5, there is shown the results of various steps in the fabrication of a plurality of transistors simultaneously. Although the description will proceed to describe the fabrication of power transistors which require the use of a heat sink, it should be understood that the invention is applicable to the fabrication of other semiconductor devices, with or without heat sinks.

Figure 1:
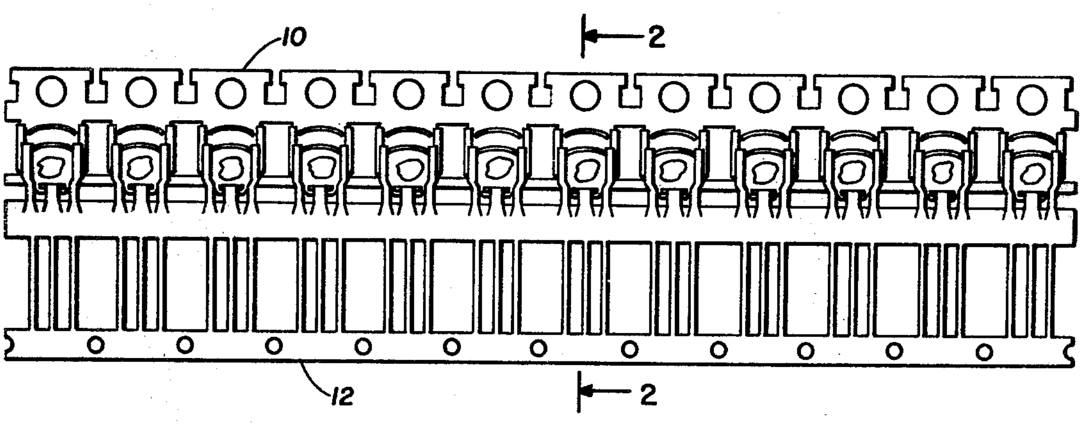
FIGS. 1–5 are views illustrating steps in the fabricating process of the present invention.
Figure 2:
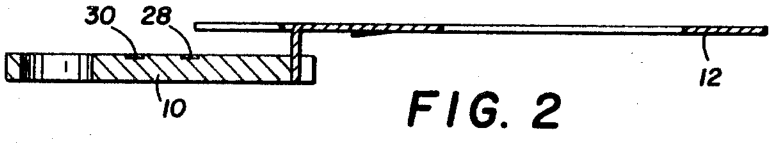

In FIGS. 1 and 2, a heat sink frame 10 made up of twelve individual heat sinks is shown staked to a lead frame 12 consisting of thirty-six leads interconnected by tie-bars, such as tie-bars 14, 16 and 18. The tie-bar between two leads is designed to extend to the edge of the mold cavity, as will be explained. This construction enables the tie-bar to have the dual function of interconnecting the leads, and providing a cavity seal between the leads. To facilitate separation of the leads and removal of the tie-bar material, the tie-bars are partially sheared. The sheared section resembles a keystone in appearance. This permits the tie-bar to be sheared and then forced back into its original flat shape to act as a mold seal.

Note, there are three leads associated with each of the twelve heat sinks. The heat sink frame 10 and the lead frame 12 are staked together by means of the center lead of this group of three. Thus, in the embodiment shown, the center lead of each group of three is mechanically and electrically connected to the heat sink. This is in accordance with standard power transistor fabrication wherein the collector electrode is electrically coupled to the sink.

Both the sink frame 10 and the lead frame 12 are preferably a coated copper material. Silver-coated copper has been found to be a satisfactory material for carrying out the process of the present invention although other materials, such as nickel-coated copper, have certain advantages. Aluminum (plain, clad or plated) may also be used where the power levels are such as not to required the heat transferability of copper.

After the sink frame 10 has been staked to the lead frame 12, a solder puddle 19 is deposited on each of the individual heat sinks in the area between the extension of the lead wires, as illustrated in FIG. 1. Next, a semiconductor wafer 20 (for example a transistor wafer) is scrubbed into the solder puddle with high frequency vibrations. This scrubbing action assures that a good mechanical attachment has been made to the heat sink to provide the best possible heat transfer coefficient between the wafer and the heat sink.

If the semiconductor wafers are supplied "wet," that is, with a small amount of solder previously deposited on the collector electrode area, then the step of depositing a solder puddle on the heat sink may be eliminated. Instead, the sink frame 10 is heated to the melting point of solder and the "wet" semiconductor wafer scrubbed onto the heated heat sink.

Figure 3:
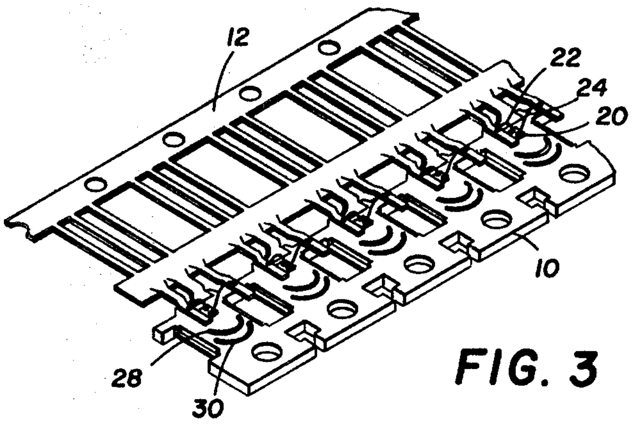

As illustrated in FIG. 3, after the semiconductor wafers have been attached to the heat sink, whisker lead wires 22 and 24 are ultrasonically bonded to the active areas on the wafer and to the leads of the frame 12. Electrically, the fabrication of the transistors is complete at this point. The emitter electrode and the base electrode of the transistor wafer 20 are connected to leads 22 and 24 and the collector electrode is electrically coupled to the heat sink and to a lead on the frame 12.

The process for encapsulating the transistors begins by etching the semiconductor wafers in a chemical bath to remove wafer imperfections and contaminants which may have been picked up by the wafer during handling and from exposure to the atmosphere. This etch is in accordance with standard techniques and is only required on Mesa transistors. After the etching step, the entire assembly is washed to remove the etching materials and then dried. Note, that the lead frame 12 provides a convenient and large handle for transferring the assembly to the various fabrication stations. This substantially reduces the accidental damaging of a semiconductor wafer by an operator. This is in contrast to processes used for fabricating transistors on an individual basis.

Immediately upon completion of the washing and drying cycle, each of the wafers is coated with a high purity silicone rubber. This coating now protects the sensitive junctions of the semiconductor wafer from additional exposure to atmospheric contamination.

One of the features of the present invention is the grooved construction of the heat sinks. Two concentric circular grooves 28 and 30 are coined into each heat sink and provide a dam for restricting the flow of the coating material to an area which will be in the mold cavity. This coating material, although somewhat viscous when applied, thins considerably when heated during the curing process.

An assembly of twelve transistors is now ready to be encapsulated simultaneously in a single cavity mold. The sink frame 10 and the lead frame 12 along with the coated transistors are placed in a mold into which is injected hot thermosetting plastic. Although various plastics may be used, a silicone plastic has been found to be preferable. After the molding step, the plastic is cured and the entire unit removed from the mold. An encapsulated assembly is illustrated in FIG. 5 with the plastic bar 32 containing the transistors illustrated in FIG. 4.

Each of the three leads for the individual transistors are now separated from the lead frame 12. This is accomplished by means of dies which cut the tie-bar metal. Another of the features of this invention is the partially sheared construction of the tie-bars as illustrated in FIG. 1. This permits cutting away the tie-bar without damaging the encapsulation. Since the encapsulating material includes a considerable amount of fiberglass, any cutting of this material dulls the dies prematurely.

Figure 6:
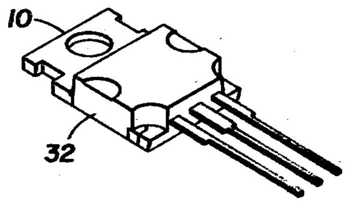
FIG. 6 is a perspective view of a transistor fabricated by the process illustrated in FIGS. 1–5.

After the tie-bar material has been removed and each of the leads separated from all others in the lead frame, the heat sink frame 10 is sawed to complete the fabrication of a plastic encapsulated transistor such as illustrated in FIG. 6. Although the fiberglass in the encapsulating material must be sawed when separating the heat sinks, these blades are larger and easily cut through the hard fiberglass material.

Figure 7:
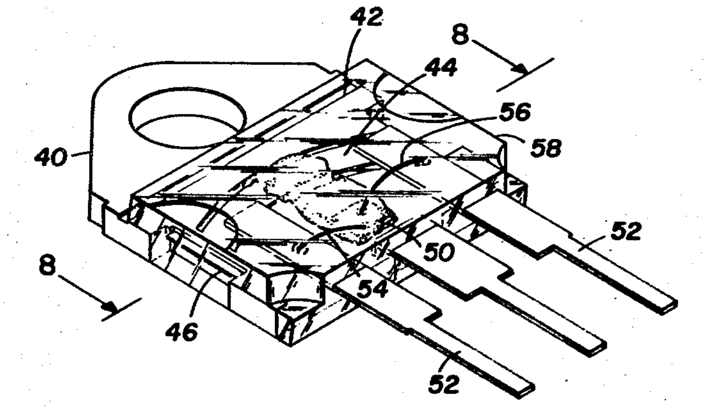
FIG. 7 is a perspective view of another transistor fabricated by the process illustrated in FIGS. 1–5.
Figure 8:
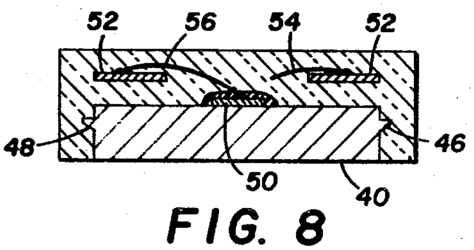
FIG. 8 is a cross-section of the transistor of FIG. 7 taken along the line 8—8.

Referring to FIG. 7, there is illustrated another power transistor fabricated by a series of processing steps similar to those illustrated in FIGS. 1–5. A heat sink 40 is one of eight individual heat sinks that were interconnected as a heat sink frame. The number of transistors that may be fabricated simultaneously as a single unit is not necessarily limited to eight or twelve but may be either more or less depending primarily upon the equipment available for carrying out the various steps. Note, that the heat sink 40 includes concentric circular grooves 42 and 44 as dams for restricting the flow of a coating material, as was described previously. The heat sink 40 also includes plastic locks to improve the bonding of the encapsulating material to the heat sink. Referring to FIG. 8, there is shown a cross-section of the heat sink 40 illustrating in detail plastic locks 46 and 48. These locks may be formed by simply striking the edge of the heat sink with a die to force a small amount of metal into the configuration illustrated. Similar plastic locks are also provided on the heat sink of the transistor illustrated in FIG. 6.

Whisker lead wires 54 and 56 are attached to the active elements of a wafer 50 mounted to the heat sink and to the leads 52. The entire assembly is encapsulated with a thermosetting plastic material. The resulting transistor is illustrated in FIG. 7 wherein the plastic body 58 is opaque, not transparent as illustrated.

Figure 9:
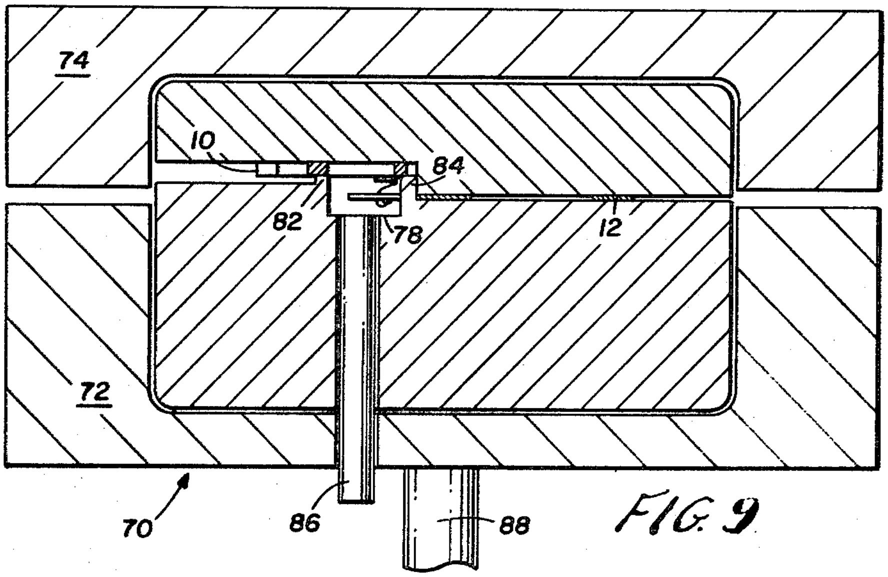
FIG. 9 is a sectional view through both the bottom and top halves of a mold for carrying out the process of the present invention.
Figure 10:
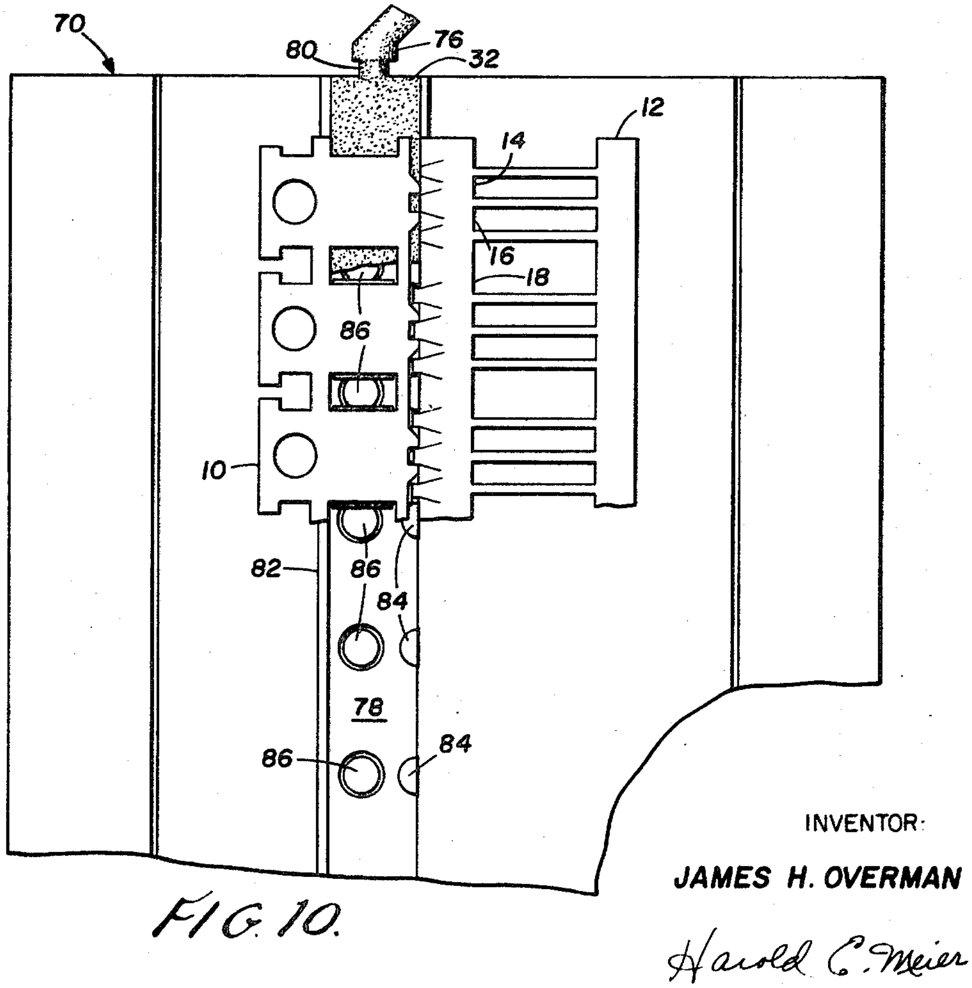
FIG. 10 is a plan view of the lower half of the mold illustrated in FIG. 9.

The transfer molding apparatus for carrying out the process of the present invention is indicated generally by the reference numeral 70 in FIGS. 9 and 10. The molding apparatus is comprised of a lower mold half 72, and an upper mold half 74. The lower mold half 72 is shown in plan view in FIG. 10 and includes the lower half of a runner channel 76 which supplies fluid plastic to the single cavity 78 through a gate 80. The lower mold half 72 also includes a seal-off strip 82 and hold-down pins 84. An array of positioning pins would also be included in the lower mold half 72 but have not been shown in an effort to avoid undue complication of the drawings. These pins would serve the purpose of properly positioning parts placed in the mold. A series of rods 86 extend through passages in the lower mold half 72 into the cavity 78 to force the molded body from the mold after the encapsulating material has been solidified.

Figure 4:
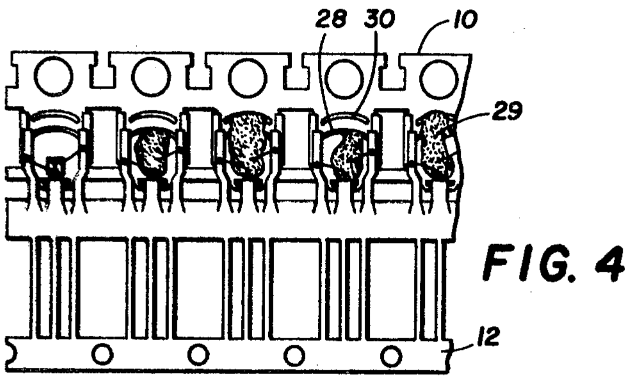
Figure 5:
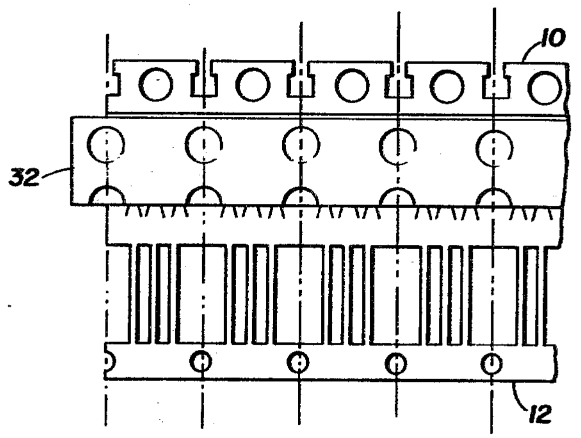

To encapsulate a plurality of semiconductor devices simultaneously, the assembly such as illustrated in FIG. 4 is placed on the lower mold half 72 with the heat sink frame facing up and the lead frame oriented toward the right. The forward edge of the tie-bars 14, 16 and 18 of the frame 12 coincide with the edge of the cavity 78 in the lower mold half 72. As explained previously, this provides a seal for the area between adjacent leads and reduces the possibility of cutting the hard fiberglass content of the encapsulating material.

The hold-down pins 84 project through the lead frame at the tie-bar edge and clamp the heat sink firmly against the upper mold half 74, as illustrated in FIG. 9, when the lower mold half 72 has been raised into position by the ram 88. The effect of the hold-down pins 84 acting on the heat sink frame assures that the heat sink surface of the finished package is flash-free. As the ram 88 moves the lower mold half 72 into position, the seal-off strip 82 "bites" into the heat sink frame several mils to also clamp the heat sink frame against the upper mold half 74, and in addition, compensates for thickness variations in the metal parts and provides a seal to eliminate flashing during the encapsulating cycle. The term "flashing" is commonly used when describing material leakage from a mold cavity. With the lower mold half 72 raised in place as illustrated in FIG. 9, the cavity 78 is fluid tight with the exception of the gate 80.

A fluid thermosetting plastic (for example, a silicone plastic) is introduced through the gate 80 from the runner 76 under considerable pressure. The plastic material fills the cavity 78 thereby completely encapsulating each of the semiconductor wafers. Because of the relatively large cavity, the plastic material flows easily into all areas with only a small possibility of entrapments. During the time the plastic material is injected into the cavity 78, both the upper mold half 74 and the lower mold half 72 are maintained at a temperature from 150 to 175° C. After the cavity has been completely filled, the molds are maintained in place for several minutes to allow an initial curing and setting-up of the plastic material.

After this preliminary cure, the lower mold half 72 is lowered by means of the ram 88. Since only relatively small amounts of plastic material will be in contact with the upper mold half 74, there is little chance of the unit adhering to the upper mold. However, considerable plastic material will be in contact with the lower mold half 72 and some sticking may be encountered. As the mold half 72 is lowered, the rods 86 eventually bottom and exert an upward force on the plastic body. This force is sufficient to eject the unit from the cavity 78. Additional curing of the plastic is now accomplished by placing the unit in an oven maintained at a temperature between 150 to 175° C.

The individual transistors are now ready to be separated. First, the tie-bars are cut to separate the individual leads. As mentioned previously, by partially shearing each tie-bar, considerable tolerance is available to prevent the cutting tools from damaging the plastic material. After the tie-bars have been cut, the heat sink frame is sawed to separate the individual transistors.

While several embodiments of the invention, together with modifications thereof, have been described in detail herein and shown in the accompanying drawings, it will be evident that various further modifications are possible without departing from the scope of the invention.

What is claimed is:

1. A process for fabricating a plurality of semiconductor devices in a single cavity mold comprising:

mounting a semiconductor device to each separate heat sink in a frame of a plurality of interconnected heat sinks, and connecting the semiconductor device to separate leads in a frame of a plurality of interconnected leads, cleaning the semiconductor devices mounted to each heat sink, coating the cleaned semiconductor devices to prevent further contamination thereof, clamping the heat sink frame in a mold cavity, and encapsulating all of the semiconductor devices in one heat sink frame simultaneously in a plastic material.

2. A process for fabricating a plurality of semiconductor devices in a single cavity mold as set forth in claim 1 including the step of coining concentric circular grooves in each of the heat sinks to restrict the flow of coating material.

3. A process for fabricating a plurality of semiconductor devices in a single cavity mold as set forth in claim 2 wherein the step of clamping the heat sink frame includes forming a seal by forcing a mold seal-off strip into the heat sink frame and projecting hold-down pins through the lead frame to firmly clamp the heat sink frame against a mold surface, thereby substantially reducing "flashing" of the plastic material from the mold cavity.

4. A process for fabricating a plurality of semiconductor devices in a single cavity mold as set forth in claim 3 including the step of ejecting the encapsulated semiconductor devices from the mold cavity.

5. A process for fabricating a plurality of semiconductor devices in a single cavity mold as set forth in claim 4 including the step of partially shearing the interconnecting material of the lead frame to facilitate separating the individual leads.

6. A process for fabricating a plurality of semiconductor devices in a single cavity mold as set forth in claim 5 including the step of separating the individual heat sinks and the individual leads.

7. A process for fabricating a plurality of encapsulated semiconductor devices, the process consisting of the steps of:

(a) mounting a plurality of semiconductor devices to a heat sink frame, and connecting said semiconductor devices to separate leads of a lead frame, said lead frame including tie bars between said leads;

(b) cleaning and covering said semiconductor devices with a protective coating to prevent further contamination;

(c) placing said heat sink frame and portions of said lead frame in a single cavity mold;

(d) injecting a thermosetting plastic material into said mold to encapsulated said heat sink frame, said semiconductor devices and portions of said lead frame to form a unitary structure;

(e) maintaining said mold at a predetermined temperature to partially cure said plastic material;

(f) removing from said mold and subjecting to a further curing cycle said unitary structure to completely cure said plastic material;

(g) removing said tie bars thereby producing a plurality of leads; and (h) separating said heat sink frame to produce a plurality of encapsulated semiconductor devices with each of said transistors including an integral heat sink.

8. A process for fabricating a plurality of encapsulated semiconductor devices, the process consisting of the steps of:

(a) mounting a lead frame to a heat sink frame by staking selected leads of said lead frame to said heat sink frame, said lead frame including a plurality of leads held together by partially severed tie bars;

(b) mounting to said heat sink frame a plurality of semiconductor devices and selectively interconnecting said semiconductor devices to said plurality of leads;

(c) cleaning and covering said semiconductor devices with a protective coating to prevent further contamination of said semiconductor devices;

(d) positioning said heat sink frame, said semiconductor devices and portions of said lead frame in a single cavity mold such that said partially severed tie bars form a seal isolating the unsevered portions of said tie bars from the interior of said single cavity mold;

(e) injecting into said single cavity mold a plastic encapsulating compound to form a unitary structure consisting of said heat sink frame, said semiconductor devices and portions of said lead frame encased in said encapsulating compound;

(f) maintaining the temperature of said mold at a predetermined value to partially cure said plastic encapsulating compound, (g) removing said unitary structure from said mold and subjecting said unitary structure to a further controlled temperature curing cycle; and (h) shearing said tie bars and separating said heat sink frame to form a plurality of individual encapsulated semiconductor devices.

References Cited

UNITED STATES PATENTS

| | | | |
|---|---|---|---|
| 3,391,426 | 7/1968 | Hugill | 29—576SUX |
| 3,413,713 | 12/1968 | Helda et al. | 29—588 |
| 3,423,516 | 1/1969 | Segerson | 29—588X |
| 3,426,423 | 2/1969 | Koch | 29—588X |

JOHN F. CAMPBELL, Primary Examiner

W. TUPMAN, Assistant Examiner

U.S. Cl. X.R.

29—589, 590; 264—272